United States Patent
Kamata et al.

(10) Patent No.: US 7,110,665 B2
(45) Date of Patent: Sep. 19, 2006

(54) THERMAL TREATMENT EQUIPMENT, THERMAL TREATMENT METHOD AND MANUFACTURING METHOD OF IMAGE DISPLAY APPARATUS

(75) Inventors: Shigeto Kamata, Kanagawa (JP); Akihiro Kimura, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/944,760

(22) Filed: Sep. 21, 2004

(65) Prior Publication Data

US 2005/0074230 A1    Apr. 7, 2005

(30) Foreign Application Priority Data

Oct. 1, 2003    (JP)    ............... 2003-343083

(51) Int. Cl.
*F21V 7/00*    (2006.01)
(52) U.S. Cl. ............ 392/420; 219/390; 118/724
(58) Field of Classification Search ........... 219/390, 219/405, 411; 392/416, 418, 420; 118/724, 118/725, 50.1

See application file for complete search history.

(56) References Cited

U.S. PATENT DOCUMENTS 5,167,717 A * 12/1992 Boitnott .............. 118/724
6,858,087 B1 * 2/2005 Hori et al. ........... 118/724

FOREIGN PATENT DOCUMENTS

JP    2000-251716    9/2000

* cited by examiner

*Primary Examiner*—Thor S. Campbell
(74) *Attorney, Agent, or Firm*—Fitzpatrick, Cella, Harper & Scinto

(57) ABSTRACT

In an apparatus for performing heating treatment of a structure composed of a substrate and a structure arranged on the front surface of the substrate, the latter structure having thermal capacity smaller than that of the substrate, heaters are arranged to be opposed to the front surface and the back surface of the substrate. A cooling body is arranged at a position opposed to the back surface of the substrate to sandwich the heater of the back surface between the cooling body and the substrate.

10 Claims, 3 Drawing Sheets

THERMAL TREATMENT EQUIPMENT, THERMAL TREATMENT METHOD AND MANUFACTURING METHOD OF IMAGE DISPLAY APPARATUS

BACKGROUND OF THE INVENTION

1. Field of the Invention

The present invention relates to thermal treatment equipment and a thermal treatment method for heating a substrate made of glass, ceramic or the like, and to a manufacturing method of an image display apparatus.

2. Related Background Art

Conventionally, image display apparatus include an image display apparatus for displaying an image on a screen by radiating electron beams on a phosphor, in addition to a liquid crystal display and a plasma display. The image display apparatus using the electron beams includes a face plate of a substrate on which the phosphor is formed, a back plate of a substrate on which surface conduction electron-emitting devices are formed as electron sources for generating the electron beams, and an outer frame for keeping a depressurized atmosphere between the two substrates. The image display apparatus using the electron beams accelerates and radiates the electron beams from the surface conduction electron-emitting devices to the phosphor in the depressurized atmosphere to make the phosphor emit light, and thereby the image display apparatus forms an image (see, for example, Japanese Patent Application Laid-Open No. 2000-251716). Incidentally, some image display apparatus are severally provided with thin plate-like spacers between the two substrates lest the two substrates should be distorted at the time of depressurizing the space enclosed by the face plate, the back plate and the outer frame.

Thermal treatment at a manufacturing process of the image display apparatus using the electron beams includes bake treatment for eliminating chemically absorbed water, in which water molecules are polarized to be mutually bonded with each other, from the surfaces of the substrates in addition to the treatment of fixing the face plate and the back plate with the outer frame put between them. When the face plate and the back plate are tried to be assembled in the depressurized atmosphere without performing the bake treatment, the pressure does not readily lower owing to the degassing of the chemical absorbed water, and then it takes a long time to reach a target degree of vacuum for assembling the face plate and the back plate.

If the bake treatment is performed to a back plate after the electric sources, wiring and the like have been formed thereon, or to a face plate after wiring and the phosphor have been formed thereon, it is better that the treatment time is shorter also for reducing a load of the thermal treatment to the devices and the wiring formed thereon. Moreover, because the bake treatment is performed a plurality of times at a manufacturing process, the treatment time at a time is desired to be shorter also for shortening a manufacturing period.

A thermal treatment apparatus for the bake treatment is equipped with a hot plate composed of a heating wire put between insulating materials in a treating chamber, and heats a substrate placed on the hot plate from the back surface of the substrate.

There has been a problem in which the temperature of a substrate does not readily rise at the time of the bake treatment because a hot plate having a large thermal capacity is used for the heating of the substrate in the thermal treatment equipment to be used for the bake treatment. In the case where a heating rate is set to be large for raising the temperature of the substrate rapidly when the bake treatment is performed after the spacers have been formed on the surface of the substrate of the back plate, the temperatures of the spacers on the surface of the substrate rise faster than the temperature of the substrate because the spacers have smaller thermal capacity in comparison with that of the substrate. Consequently, the spacers sometimes are broken owing to the temperature differences between the spacers and the substrate. Moreover, the temperature distribution of the substrate sometimes becomes uneven and the substrate sometimes becomes warped. On the other hand, when the heating rate is set to be slow for making the temperature distribution even, a problem in which the treatment time becomes longer is generated.

SUMMARY OF THE INVENTION

It is an object of the present invention to provide heating treatment equipment, a heating treatment method and a manufacturing method of an image display apparatus, which make it possible to perform the uniform heating and the uniform cooling of a substrate in a time shorter than that of the conventional ones.

The present invention is directed to heating treatment equipment for heating a substrate and a structure arranged on a front surface of the substrate, the structure having thermal capacity smaller than that of the substrate, the heating treatment equipment including: a first heater arranged to be opposed to a back surface of the substrate; a first cooling body for cooling the substrate, the first cooling body arranged to be opposed to the back surface of the substrate to sandwich the first heater between the first cooling body and the substrate; and a second heater arranged to be opposed to the front surface of the substrate, the second heater heating in a quantity smaller than that of the first heater at a time of heating treatment.

Moreover, the present invention is a heating treatment method using the above-mentioned heating treatment equipment, the method including the steps of: heating the substrate and the structure by means of the first and the second heaters; and cooling the substrate by means of the first cooling body after the step of heating.

Moreover, the present invention is a manufacturing method of an image display apparatus including the steps of heating a substrate, and a plurality of spacers fixed on a front surface of the substrate, and cooling the substrate and the spacers after the step of heating, wherein the step of heating is performed by means of a first heater arranged to be opposed to a back surface of the substrate and a second heater arranged to be opposed to the front surface of the substrate, the second heater heating in a quantity smaller than that of the first heater at a time of heating, and wherein the step of cooling is performed by means of a first cooling body arranged to be opposed to the back surface of the substrate to sandwich the first heater between the first cooling body and the substrate.

DETAILED DESCRIPTION OF THE
PREFERRED EMBODIMENTS

Heating treatment apparatus according to the present invention is heating treatment equipment for heating a substrate and a structure arranged on a front surface of the substrate, the structure having thermal capacity smaller than that of the substrate, the heating treatment equipment including: a first heater arranged to be opposed to a back surface of the substrate; a first cooling body for cooling the substrate, the first cooling body arranged to be opposed to the back surface of the substrate to sandwich the first heater between the first cooling body and the substrate; and a second heater arranged to be opposed to the front surface of the substrate, the second heater heating in a quantity smaller than that of the first heater at a time of heating treatment.

Because the cooling body is arranged to be opposed to the substrate to sandwich the heater between the cooling body and the substrate in the present invention, the heated substrate can be cooled more rapidly. In addition, by cooling the substrate from the same side as that at the time of heating, the switching between heating and cooling of the substrate can be more rapidly performed.

Moreover, because the substrate is heated from both of the front surface, on which the structure is arranged, and the back surface of the substrate in the present invention, heating efficiency is improved.

Moreover, because the temperature of the structure having thermal capacity smaller than that of the substrate easily rise, the temperatures of the structure and the substrate rise at speeds nearer to each other by heating the structure at a temperature lower than that of the side of the back surface of the substrate from the front surface of the substrate by means of the second heater having a heating value smaller than that of the first heater arranged to be opposed to the back surface of the substrate at the time of heating treatment.

Moreover, because the substrate is cooled from the back surface of the substrate different from the front surface thereof, on which the structure is provided, in the present invention, the temperature of the substrate can be more uniformly lowered in the surface. Consequently, a warp and a breakage of the substrate originated in a temperature distribution of the substrate, and a breakage of the structure originated in a temperature difference between the substrate and the structure can be prevented.

Moreover, it is more preferable to include a heat reflecting member also for reflecting heat from the heater to the substrate in the heating treatment apparatus of the present invention, for improving the heating efficiency.

In case of proving the above-mentioned heat reflecting member, the heat reflecting member reflects the radiant heat generated by the heater to the substrate, and consequently the temperature of the substrate can be more rapidly raised.

Moreover, in case of proving the above-mentioned heat reflecting member, it is preferable that the cooling body has thermal emissivity larger than that of the heat reflecting member for improving the cooling efficiency.

In the case where the cooling body has the thermal emissivity larger than that of the heat reflecting member, heat is easy to absorb by the cooling body more than by the heat reflecting member at the time of cooling the substrate, and consequently the cooling efficiency of the substrate is further improved.

Moreover, it is preferable that a second cooling body for cooling the substrate is further arranged also on the side of the front surface of the substrate in the heating treatment apparatus of the present invention, for improving the cooling efficiency of the substrate.

Moreover, it is preferable that the second cooling body has a heat absorption quantity smaller than that of the first cooling body arranged on the side of the back surface of the substrate at a time of cooling the substrate.

Moreover, because the temperature of the structure having thermal capacitance smaller than that of the substrate is easily lowered by cooling, the temperatures of the structure and the substrate lower at speeds nearer to each other by cooling the structure at a temperature higher than that of the substrate from the side of the front surface of the substrate by means of the second cooling body having the heat absorption quantity smaller than that of the first cooling body arranged on the side of the back surface of the substrate at the time of cooling the substrate.

Moreover, the present invention is a heating treatment method using the above-mentioned heating treatment equipment, the method including the steps of: heating the substrate and the structure by means of the first and the second heaters; and cooling the substrate by means of the first cooling body, or by means of the first and the second cooling bodies after the step of heating.

In the present invention, because the substrate is cooled by the cooling body after the heating of the substrate by means of the heater, the temperature of the substrate is more rapidly lowered.

Moreover, the substrate is cooled by the cooling body arranged to be opposed to the substrate to sandwich the heater between the cooling body and the substrate, and the substrate is cooled from the same side as that at the time of heating after the heating of the substrate. Consequently, the switching of the heating to the cooling of the substrate can be rapidly performed.

Moreover, the present invention is a manufacturing method of an image display apparatus using the heating treatment equipment or the heating treatment method, both described above.

For example, the present invention is a manufacturing method of an image display apparatus including the steps of heating a substrate, and a plurality of spacers fixed on a front surface of the substrate, and cooling the substrate and the spacers after the step of heating, wherein the step of heating is performed by means of a fist heater arranged to be opposed to a back surface of the substrate and a second heater arranged to be opposed to the front surface of the substrate, the second heater heating in a quantity smaller than that of the first heater at a time of heating, and wherein the step of cooling is performed by means of a first cooling body arranged to be opposed to the back surface of the substrate to sandwich the first heater between the first cooling body and the substrate.

In the present invention, because the substrate is heated and cooled at higher speeds than conventional ones for removing chemically absorbed water from the substrate used for the image display apparatus, the manufacturing period of the image display apparatus can be more shortened.

In the present invention, because the cooling body is arranged to be opposed to the substrate to sandwich the heater between the cooling body and the substrate, not only the heated substrate can be cooled more rapidly, but also the switching of the heating to the cooling of the substrate becomes faster. Consequently, the substrate can be thermally processed in a shorter time in comparison with prior art.

Moreover, even if the structure having different thermal capacity from that of the substrate is provided on a surface of the substrate, it can be prevented that a temperature distribution is formed in the substance, and it becomes possible to heat and to cool the substrate and the structure in a short time without generating any warps and any breakages in them.

The heat treatment apparatus of the present invention is provided with a cooling body for cooling a substrate more rapidly after heat treatment is performed to the substrate at a position opposed to the substrate.

The embodiments of the heat treatment equipment of the present invention are described.

REFERENTIAL EXAMPLE

Figure 1:
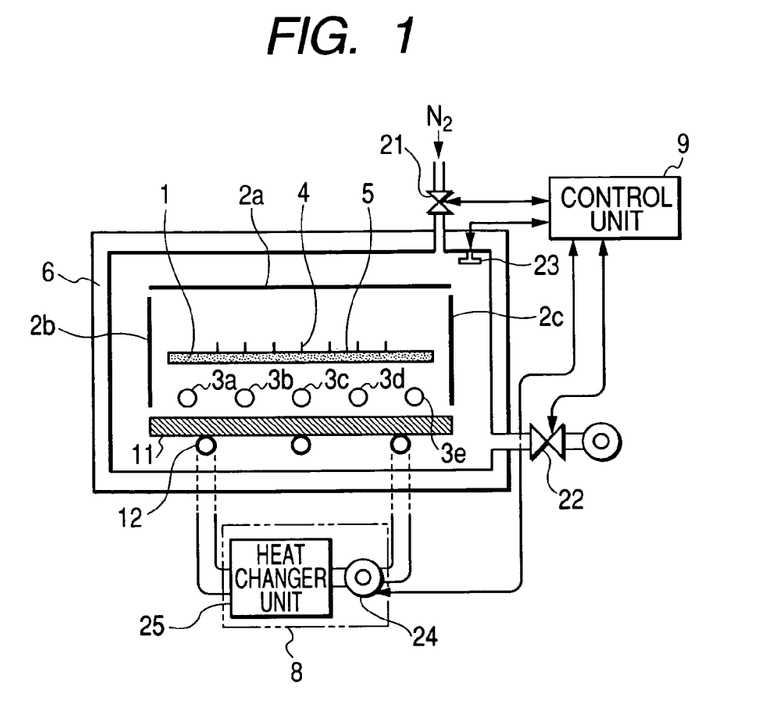
FIG. 1 is a schematic sectional view showing an example of the configuration of heating treatment equipment.

First, FIG. 1 is a schematic sectional view showing an example of the configuration of heat treatment equipment.

The heat treatment equipment is configured to include a vacuum chamber 6 to be a treatment chamber, reflector plates 2 being heat reflecting members enclosing a substrate 1 being an object of heat treatment, heaters 3a–3e being heating elements, a cooling plate 11 being a cooling body, a cooler 8 for flowing coolant through a cooling pipe 12 attached to the cooling plate 11, and a control unit 9 for controlling each section such as the heaters 3a–3e and cooler 8. When the substrate 1 is placed on supporting pins (not shown) for supporting the substrate 1 at the time of heat treatment, the back surface of the substrate 1 is arranged to be opposed to the heaters 3a–3e.

An exhaust pump 10 for depressurizing the inside of the vacuum chamber 6 is connected to the vacuum chamber 6 through an exhaust pipe. The exhaust pump 10 is provided for sucking chemical substances bled from the surface of the substrate 1 to the side of the exhaust pump 10 by depressurizing the inside of the vacuum chamber 6 during the heating of the substrate 1. An exhaust valve 22 for exhausting the gas in the vacuum chamber 6 and for stopping the exhaustion is provided to the exhaust pipe. A pressure gauge 23 for monitoring pressure is provided in the vacuum chamber 6, and the information of the pressure in the vacuum chamber 6 is transmitted to the control unit 9 through a communication line.

Moreover, the vacuum chamber 6 is connected to a gas bomb, in which nitrogen is filled, through a gas pipe arrangement for returning the depressurized inside of the vacuum chamber 6 to the atmospheric pressure. A vent valve 21 for flowing nitrogen from the gas bomb to the vacuum chamber 6 and for stopping the flow of the nitrogen is provided to the gas pipe arrangement. Moreover, a cover unit (not shown) for carrying in and out the substrate 1 is provided on the vacuum chamber 6.

The heaters 3a–3e are rod heaters of the type of flowing an electric current in a heating wire, which rod heaters are represented by a sheath heater, a cartridge heater and the like. The heaters 3a–3e are arranged on the same plane on the side of the back surface of the substrate 1 at regular intervals to heat the substrate 1 from the back surface thereof by radiant heat.

The reflector plates 2 reflect the radiant heat from the heaters 3 to the substrate 1, and thereby raise the temperature of the substrate 1 efficiently. The reflector plates 2 are also provided on the front side and the rear side in the drawing in addition to reflector plates 2a–2c shown in FIG. 1. A reflector plate, which is not shown in the drawing, is attached to the inner side of the cover unit (not shown), the reflector plate interlocks with the operation of the cover unit.

The reflector plates 2 and the cooling plate 11 are fixed to the vacuum chamber 6. The supporting pins (not shown) and the heaters 3 are fixed to the reflector plates 2. The heaters 3 are fixed to the reflector plates 2 with heat insulating materials put between them for suppressing the flowing out of heat to the other places than the vacuum chamber 6. The cooling plate 11 and the five reflector plates 2 in the vacuum chamber 6 are arranged to cover the substrate 1 and the heaters 3 on the supporting pins.

The cooling plate 11 is provided at a position distant from the substrate 1 more than the heaters 3a–3e, and cools the substrate 1 from the back surface thereof in a noncontact state. By setting the quality of material of the cooling plate 11 to have a thermal emissivity larger than that of the reflector plates 2, heat is easy to absorb by the cooling plate 11 more than by the reflector plate 2, and the cooling efficiency of the substrate 1 is improved more. In case of adopting copper sheets as the reflector plates 2, for example, a stainless steel (SUS) sheet is used as the cooling plate 11. The cooling pipe 12 is fixed to the cooling plate 11 by brazing, and is connected to the cooler 8. The cooler 8 includes a circulating pump 24 for circulating the coolant, and a heat changer unit 25 for lowering the temperature of the coolant. The coolant is pushed out in the cooling pipe 12 toward the cooling plate 11 by the circulating pump 24, and enters the heat changer unit 25 in a state of absorbing the heat in the space enclosed by the cooling plate 11 and the reflector plates 2. After the heat is taken away by the heat changer unit 25, the coolant returns to the circulating pump 24 again. The heat in the space enclosed by the cooling plate 11 and the reflector plates 2 is taken away by the circulation of the coolant in such a way, and the temperature of the substrate 1 can be lowered.

The control unit 9 is equipped with a central processing unit (CPU) for executing predetermined processing in accordance with a program, and a memory for storing the program. The control unit 9 is connected to the cooler 8 to control the circulating pump 24 and the heat changer unit 25. The cover unit (not shown), the vent valve 21 and the exhaust valve 22 are connected to the control unit 9, and the opening and the closing of them are controlled by signals from the control unit 9. A carrier robot (not shown) for carrying in the substrate 1 into the vacuum chamber 6 and for carrying out the substrate 1 from the vacuum chamber 6 after thermal treatment is provided. The carrier robot transmits and receives control signals with the control unit 9 through a communication line, and carries the substrate 1 into the vacuum chamber 6 through the cover unit to place the substrate 1 on the supporting pins (not shown) in accordance with a control signal from the control unit 9.

In the present referential example, the substrate 1 is a back plate to be used for an image display apparatus. On the surface of the substrate 1, spacers 4 and structures 5 such as electric sources and wiring are provided.

Next, the operation of heating treatment by the thermal treatment equipment having the configuration described above is described.

Figure 2:
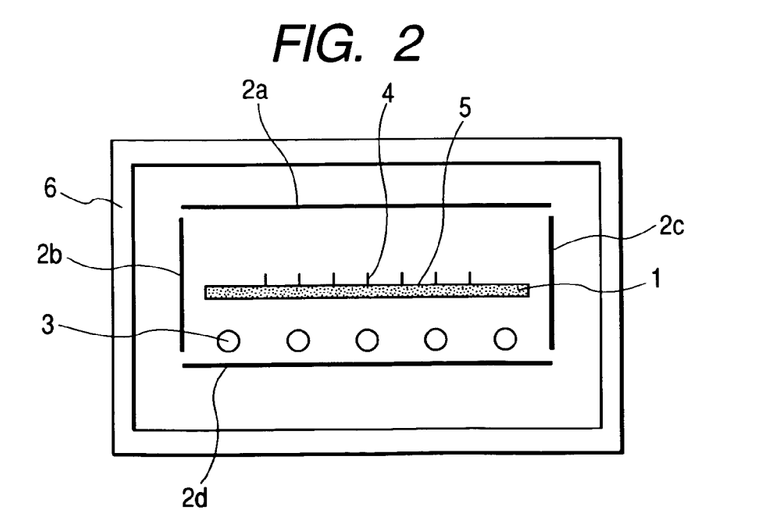
FIG. 2 is a schematic sectional view for illustrating the operation of heating treatment.

FIG. 2 is a schematic sectional view of the thermal treatment equipment for illustrating the operation of the heating treatment. Hereupon, for illustrating, a reflector plate 2d is provided in place of the cooling plate 11 shown in FIG. 1. The reflector plate 2d is fixed to the vacuum chamber 6.

An operator places the substrate 1 to be an object of thermal treatment on the carrier robot (not shown) of the thermal treatment equipment in the state in which the inside of the vacuum chamber 6 is depressurized by the exhaust pump 10. Successively, when the operator operates the thermal treatment equipment to input a signal instructing the execution of thermal treatment, the control unit 9 executes the following vent operation. The vent operation is a series of operations performed in order. The operations are ones composed of closing the exhaust valve 22, opening the vent valve 21 to introduce nitrogen into the vacuum chamber 6, and closing the vent valve 21 at the time of receiving a signal indicating the atmospheric pressure from the pressure gauge 23 after that.

When the control unit 9 opens the cover unit (not shown) after the vent operation, the control unit 9 transmits a carry-in control signal being a signal instructing the carrier robot to carry in the substrate 1. When the carrier robot receives the carry-in control signal from the control unit 9, the carrier robot places the substrate 1 on the supporting pins (not shown) in the vacuum chamber 6. The control unit 9 closes the cover portion and opens the exhaust valve 22. By the opening of the exhaust valve 22, the gas in the vacuum chamber 6 is exhausted by the exhaust pump 10, and the inside of the vacuum chamber 6 is depressurized to $10^{-5}$ Pa. Successively, the control unit 9 turns on the heaters $3a$–$3e$.

The heaters $3a$–$3e$ raise their temperatures to set the temperature of the substrate 1 to be within a range from 350° C. to 400° C., and the heaters $3a$–$3e$ hold the substrate 1 in that state for five to ten minutes. Thus the heaters $3a$–$3e$ supply thermal energy to the substrate 1 by radiation. Because the heaters $3a$–$3e$ are arranged at regular intervals, the thermal energy is supplied to the back surface of the substrate 1 uniformly. A part of the thermal energy given to the substrate 1 is absorbed by chemically absorbed water adhering to the surface of the substrate 1. The chemically absorbed water converts thermal energy to kinetic energy, and springs out from the surface of the substrate 1. The sprung-out chemically absorbed water is sucked into the side of the exhaust pump 10 where pressure is lower. By degassing from the substrate 1, the pressure in the vacuum chamber 6 rises to the range from $10^{-4}$ Pa to $10^{-3}$ Pa.

By performing the bake treatment of the substrate 1 in the way as described above, the chemically absorbed water on the surface of the substrate 1 is removed. Incidentally, if wiring is formed on the surface of the substrate 1 by means of a material having a melting point lower than 350° C., the substrate 1 is heated at a temperature which does not exceed the melting point of the wiring material. The heating treatment in the case where indium is used as the wiring material is performed, for example, for 4 to 10 hours at a temperature of 120° C.

The quality of material of the spacers 4 is glass similar to that of the substrate 1. Because a spacer 4 is thinner than the substrate 1, the volume of the spacer 4 is small for its surface area, and the thermal capacity of the spacer 4 is smaller than that of the substrate 1. The emissivity of the surface of the substrate 1 changes according to the configurations of appendages such as the spacers 4 and the structures 5, each having thermal capacity different from that of the substrate 1. On the other hand, there are no appendages on the back surface of the substrate 1, and only surface treatment for flattening is uniformly performed on the back surface. Consequently, the emissivity of the back surface is almost constant. Accordingly, the heaters 3 of heat sources are provided on the back surface having no appendages in comparison with the front surface of the substrate 1, and heat is given to the back surface of the substrate 1 from the heaters 3 the temperatures of which have risen. Thereby the temperature of the substrate 1 can be uniformly raised in the surface in a short time. Moreover, it is suppressed that temperature distribution is generated owing to the difference of inflows of heat into the substrate 1 which corresponds to the difference of the emissivity of the surface, and it can be prevented that only the temperatures of the spacers 4 having little thermal capacity rise earlier.

Next, a procedure of the cooling operation by the thermal treatment equipment described above is described.

Figure 3:
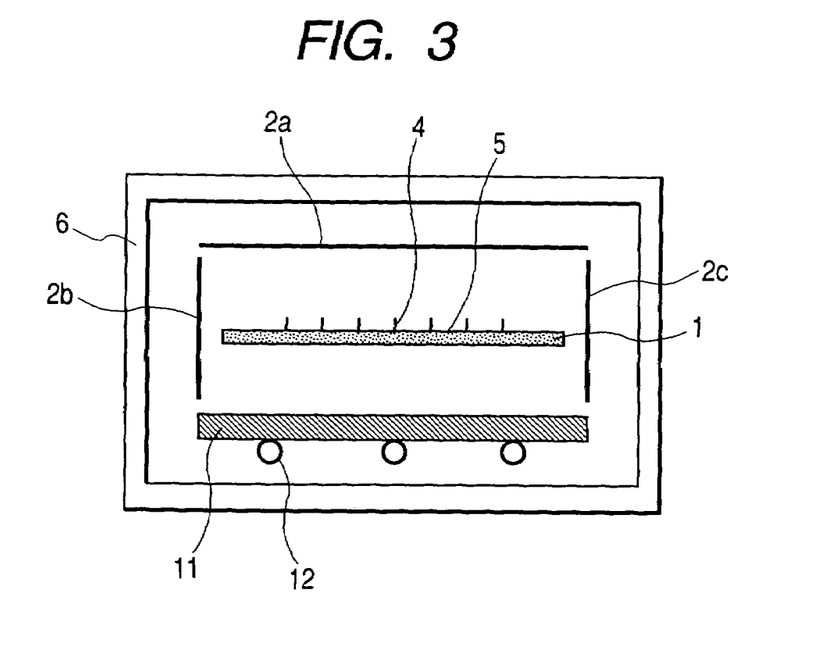
FIG. 3 is a schematic sectional view for illustrating the operation of cooling treatment.

FIG. 3 is a schematic sectional view of a piece of thermal treatment equipment for illustrating the operation of cooling treatment. Hereupon, the heaters 3 shown in FIG. 1 are omitted to be shown in the drawing.

After the heating treatment has been performed as mentioned above, the control unit 9 turns off the heaters $3a$–$3e$, and turns on the circulating pump 24 of the cooler 8 to flow coolant through the cooling pipe 12. The heat of the substrate 1 is absorbed by the coolant through the cooling plate 11 by radiation, and the temperature of the substrate lowers. The temperature of the coolant, which has risen to be high owing to the absorption of the heat by the coolant, is lowered by the heat changer unit 25. Then, the coolant is again sent toward the cooling plate 11 through the cooling pipe 12 by the circulating pump 24. In such a way, the temperatures of the heaters $3a$–$3e$ and the substrate 1 are gradually lowered.

When the temperature of the substrate 1 is lowered to 100° C. or less by cooling the substrate 1 for a time which has been obtained by experiments, the control unit 9 stops the circulating pump 24 for stopping the cooling of the substrate 1. At this time, the temperature of the substrate 1 is prevented from being lowered below the room temperature for preventing condensation. Successively, after the control unit 9 has performed the above-mentioned vent operation, the control unit 9 opens the cover unit and transmits a carry-out control signal being a signal instructing the carrier robot to carry out the substrate 1 to the carrier robot. When the carrier robot receives the carry-out control signal from the control unit 9, the carrier robot takes out the substrate 1 from the vacuum chamber 6.

As described above, after the heating of the substrate 1 by the heaters 3, the substrate 1 is cooled by the cooling plate 11. Consequently, the temperature of the substrate 1 is lowered more rapidly. Moreover, after the heating of the substrate 1, the substrate 1 is cooled by the cooling plate 11 arranged to be opposed to the substrate 1 with the heaters 3 put between them, and the substrate 1 is cooled from the same side as that at the time of the heating of the substrate 1. Consequently, the switching from the heating to the cooling of the substrate 1 is performed rapidly.

The emissivity of the front surface of the substrate 1 changes correspondingly to the configuration of appendages, but the emissivity of the back surface of the substrate 1 is almost constant. Accordingly, the cooling plate 11 of heat sources is provided on the side of the back surface, on which there are no appendages in comparison with the front surface of the substrate 1, and the cooling plate 11 takes away the heat from the back surface of the substrate 1. Thereby, the temperature of the substrate 1 can be uniformly lowered in the surface in a short time. Moreover, it is suppressed that temperature distribution is generated owing to the difference of discharge quantities of heat from the substrate 1 which corresponds to the difference of the emissivity of the surface, and it can be prevented that only the temperatures of the spacers 4 having little thermal capacity lower more rapidly.

In the way mentioned above, heat is principally given to the substrate 1 from the side of the back surface thereof and the heat is recovered from the substrate 1 from the same side. Thereby, the temperature of the substrate 1 can be raised or lowered uniformly in the surface in a short time. Moreover, it does not happen that only the temperature changes of the spacers 4 having little thermal capacity occur more rapidly. Consequently, a warp and a breakage of the substrate 1 originated in the temperature differences of the substrate 1, and breakages of the spacers 4 originated in the temperature differences between the substrate 1 and the spacers 4 can be prevented. Moreover, the substrate 1 can be heated and cooled at high speeds.

Next, a manufacturing method of an image display apparatus using the above-mentioned substrate 1 is described.

Similarly to the case of the back plate mentioned above, the above-mentioned thermal treatment is also performed to the face plate, on which appendages such as phosphor and wiring are formed. After that, low-melting glass is coated on the two substrates of the back plate and the face plate, and on the outer frame. Then, the two substrates are superposed on each other with the outer frame put between them, and the two substrates are heated to be fixed. Successively, the gas in the space enclosed by the two substrates and the outer frame is exhausted by the exhaust pump through the pipe arrangement connected to the outer frame.

After that, a voltage is applied to the substrates for performing an electrifying process, and electron-emitting regions are formed on the surface of the back plate. Successively, the assembled two substrates and the outer frame receive bake treatment to perform the degassing of the space enclosed by the two substrates and the outer frame sufficiently. After sealing the connecting portions between the outer frame and the pipe arrangement for keeping the degree of vacuum in the space, the pipe arrangement is removed. After that, the surface conduction electron-emitting devices, the wiring and the like are connected with previously provided drive circuits (not shown).

In the image display apparatus mentioned above, chemically absorbed water is sufficiently removed from the two substrates of the back plate and the face plate. Consequently, at the time of bake treatment of the assembled two substrates and the outer frame, the pressure in the vacuum chamber reaches a target degree of vacuum rapidly and the treating time can be shortened.

(First Embodiment)

In the referential example, the substrate 1 is heated from the back surface thereof. In the present embodiment, auxiliary heaters for heating the substrate 1 from the side of the front surface are provided in the configuration of the referential example for heating the substrate 1 also from the front surface thereof, and consequently the heating efficiency of the substrate 1 is heightened.

The configuration of the thermal treatment equipment of the present embodiment is described. Incidentally, the components similar to those of the referential example are denoted by the same reference marks, and their detailed description is omitted.

Figure 4:
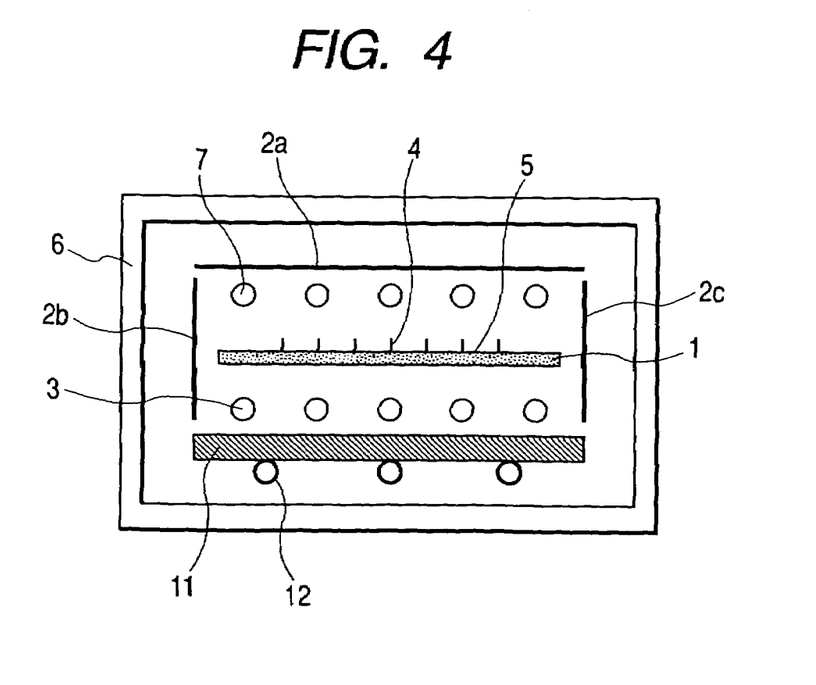
FIG. 4 is a schematic sectional view showing an example of the configuration of heating treatment equipment of a first embodiment of the present invention.

FIG. 4 is a schematic sectional view showing the configuration of the thermal treatment equipment of the present embodiment. In FIG. 4, characteristic portions of the present embodiment are shown, and a part of the components similar to those of the referential example shown in FIG. 1 is omitted to be shown in the drawing.

As shown in FIG. 4, auxiliary heaters 7 for heating the substrate 1 from the side of the front surface thereof subsidiarily are provided, and the auxiliary heaters 7 are connected to the control unit 9. The auxiliary heaters 7 are located at positions nearer to the substrate 1 than the reflector plate 2*a* on the side of the front surface of the substrate 1. When the substrate 1 is heated, the output of the auxiliary heaters 7 is set to be smaller than that of the heaters 3, and the temperatures of the auxiliary heaters 7 are set to be lower than those of the heaters 3.

The operation of the thermal treatment equipment of the present embodiment is described.

When the substrate 1 is heated by the heaters 3 from the back surface thereof similarly to the referential example, the control unit 9 turns on the auxiliary heaters 7, the temperatures of which are set to be lower than those of the heaters 3, to heat the appendages and the substrate 1 from the side of the front surface thereof. Because the thermal capacity of the appendages is lower then that of the substrate 1, the temperatures of the appendages and the temperature of the substrate 1 rise at speeds nearer to each other by the setting of the temperatures of the auxiliary heaters 7 to be lower than the temperatures of the heaters 3. When the temperature of the substrate 1 becomes in a range from 350° C. to 400° C., the temperature is kept for five minutes to ten minutes in that state.

After that, as described with regard to the referential example, the control unit 9 turns off the heaters 3*a*–3*e*, and turns on the circulating pump 24 of the cooler 8 to flow the coolant through the cooling pipe 12. When the temperature of the substrate 1 is lowered to 100° C. or less, the control unit 9 stops the circulating pump 24.

In the present embodiment, the heating efficiency is heightened by the provision of the auxiliary heaters 7 on the side of the front surface of the substrate 1. Moreover, it becomes possible to perform the temperature adjustment for heating the appendages such as the spacers 4 having smaller thermal capacity in comparison with the substrate 1 occupying the most of the volume of the heating objects, and the breakage of the spacers 4 owing to temperature differences can be suppressed.

(Second Embodiment)

In the first embodiment, the substrate 1 is cooled from the back surface thereof. In the present embodiment, an auxiliary cooling plate for cooling the substrate 1 from the side of the front surface is provided in the configuration of the first embodiment for cooling the substrate 1 also from the front surface thereof, and consequently the cooling efficiency of the substrate 1 is heightened.

The configuration of the thermal treatment equipment of the present embodiment is described. Incidentally, the components similar to those of the referential example and the first embodiment are denoted by the same reference marks, and their detailed description is omitted.

Figure 5:
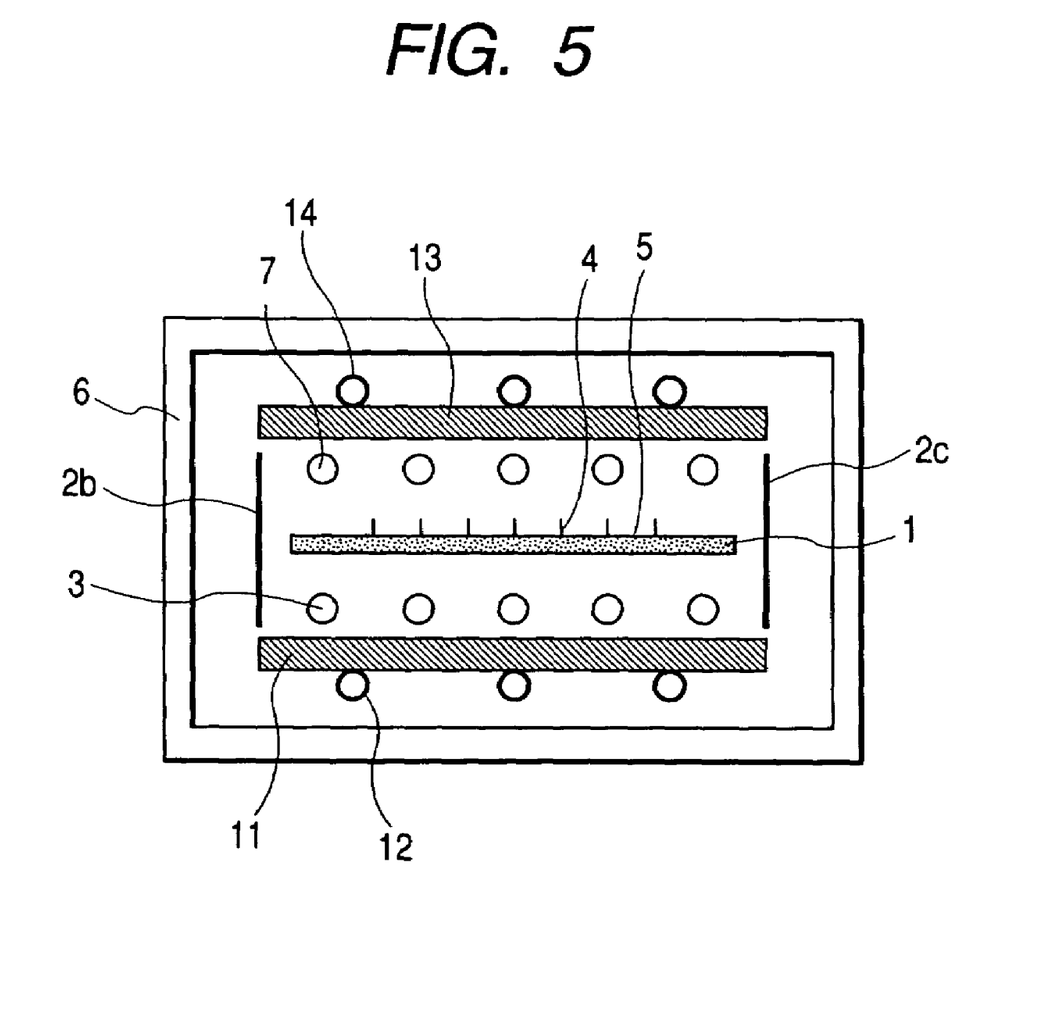
FIG. 5 is a schematic sectional view showing an example of the configuration of heating treatment equipment of a second embodiment of the present invention.

FIG. 5 is a schematic sectional view showing the configuration of the thermal treatment equipment of the present embodiment. In FIG. 5, characteristic portions of the present embodiment are shown, and a part of the components similar to those of the referential example shown in FIG. 1 is omitted to be shown in the drawing.

As shown in FIG. 5, the present embodiment is equipped with an auxiliary cooling plate 13 for cooling the substrate 1 from the front surface thereof subsidiarily, and auxiliary cooling pipe 14 for flowing coolant. The auxiliary cooling pipe 14 is fixed to the auxiliary cooling plate 13, and is connected to a not shown auxiliary cooler. Then, the auxiliary cooler is connected to the control unit 9. The auxiliary cooling plate 13 is provided in place of the reflector plate 2*a* of the thermal treatment in the second embodiment shown in FIG. 4. When the substrate 1 is cooled, the temperature of the auxiliary cooling plate 13 is set to be higher than that of the cooling plate 11. Consequently, the heat recovery quantity of the auxiliary cooling plate 13 is smaller than that of the cooling plate 11, and the emissivity of the auxiliary cooling plate 13 is smaller than that of the cooling plate 11. Incidentally, by setting the temperature of the coolant made to be flown through the auxiliary cooling pipe 14 to be higher than that of the cooling pipe 12, the temperature of the auxiliary cooling plate 13 can be set to be higher than that of the cooling plate 11.

The operation of the thermal treatment equipment of the present embodiment is described.

When the substrate 1 is heated by the heaters 3 from the back surface thereof similarly to the first embodiment, the control unit 9 turns on the auxiliary heaters 7, the temperatures of which are set to be lower than those of the heaters 3, to heat the appendages and the substrate 1 from the side of the front surface thereof. When the temperature of the substrate 1 becomes in a range from 350° C. to 400° C., the temperature is kept for five minutes to ten minutes in that state.

After that, when the substrate 1 is cooled by the cooling plate 11 from the back surface of the substrate 1 similarly in the first embodiment, the control unit 9 flows the coolant to the auxiliary cooling plate 13 having the temperature set to be higher than that of the cooling plate 11, and cools the appendages and the substrate 1 from the side of the front surface of the substrate 1. Because the thermal capacity of the appendages is smaller than that of the substrate 1, the temperatures of the appendages and the temperature of the substrate 1 lower at speeds nearer to each other by setting the temperature of the auxiliary cooling plate 13 to be higher than that of the cooling plate 11.

In the present embodiment, the cooling efficiency is heightened by the provision of the auxiliary cooling plate 13 on the side of the front surface of the substrate 1. Moreover, it becomes possible to perform the temperature adjustment for cooling the appendages such as the spacers 4 having smaller thermal capacity in comparison with the substrate 1 occupying the most of the volume of the cooling objects, and the breakage of the spacers 4 originating in temperature differences can be further suppressed. Now, in the present embodiment, the auxiliary cooling plate 13 is provided in the configuration of the first embodiment, but the auxiliary cooling plate 13 may be provided in the configuration of the referential example.

Incidentally, in the referential example and the first and the second embodiments described above, the heaters 3 may be rod heaters of halogen lamps in addition to the above-mentioned sheath heaters and the cartridge heaters. Moreover, the rod heaters are used as the heaters 3, but a heater composed of a heating wire wound to be a spiral on a plane in parallel with the substrate 1 may be adopted. In this case, by configuring the heater to have a gap between each wire, the cooling plate 11 can cool the substrate 1 through the gap.

Moreover, although the reflector plates 2 are not cooled, the reflector plates 2 may be also cooled by fixing the cooling pipe 12 and/or the auxiliary cooling pipe 14 on the cooling plates. The cooling of the reflector plates 2 improves the cooling efficiency of the substrate 1.

Moreover, the circulating pump 24 and the heat changer unit 25 are provided for flowing the coolant through the cooling pipe 12 and the auxiliary cooling pipe 14, but city water (supplied through a public service) may be flown through the cooling pipe 12 and the auxiliary cooling pipe 14 without providing the circulating pump 24 and the heat changer unit 25. In this case, city water valves for flowing the city water and for stopping the city water are provided to the cooling pipe 12 and the auxiliary pipe 14, and the city water valves are operated by control signals from the control unit 9 in place of the circulating pump 24. The heat absorbed by the city water diffuses into the air by natural heat radiation. Then, in case of using the city water, the city water is not limited to the case where the city water is flown through both of the two cooling pipes of the cooling pipe 12 and the auxiliary cooling pipe 14, but the city water may be flown through either of the two pipes and a cooler may be used for the other pipe.

Moreover, the case of using substrates of the back plate and the face plate, both provided with the appendages, is described, but the substrates may be ones which are not provided with the appendages. By performing a process for removing chemically absorbed water from a substrate at a stage before being provided with the appendages, the amount of degassing at the time of thermal treatment after the process decreases, and the decompression in the inside of the treatment chamber can be performed more rapidly to shorten the thermal treatment time.

Moreover, because the supporting pins (not shown) and the heaters 3 are fixed on the reflector plates 2, but the supporting pins and the heaters 3 may be fixed to the cooling plate 11 or to the vacuum chamber 6.

Moreover, in the case where the image display apparatus is manufactured by the use of the substrate receiving the thermal treatment in accordance with the first and the second embodiments by a method similar to that described with regard to the referential example, the advantages similar to those of the referential example can be obtained.

This application claims priority from Japanese Patent Application No. 2003-343083 filed on Oct. 1, 2003, which is hereby incorporated by reference herein.

What is claimed is:

1. A manufacturing method of an image display apparatus including the steps of heating a substrate, and a plurality of spacers fixed on a front surface of the substrate and having a heat capacity smaller than a heat capacity of the substrate, and cooling the substrate and the spacers after said step of heating, wherein said step of heating is performed by means of a first heater arranged in opposition to a back surface of the substrate and a second heater arranged in opposition to the front surface of the substrate, with a heat quantity of the second heater at the heating step being smaller than a heat quantity of the first heater at the heating step, and wherein said step of cooling is performed by means of a first cooling body arranged in opposition to the back surface of the substrate to sandwich the first heater between the first cooling body and the substrate.

2. A manufacturing method of an image display apparatus according to claim 1, wherein said step of cooling is performed by means of the first cooling body arranged in opposition to the back surface of the substrate to sandwich the first heater between the first cooling body and the substrate, and a second cooling body arranged in opposition to the front surface of the substrate to sandwich the second heater between the second cooling body and the substrate.

3. A manufacturing method of an image display apparatus according to claim 2, wherein the second cooling body has a heat absorption quantity smaller than that of the first cooling body at a time of cooling of the substrate.

4. A heating treatment method for heating a substrate and a structure arranged on a front surface of the substrate, the structure having thermal capacity smaller than that of the substrate, the heating treatment method comprising:

a heating step for heating the substrate and the structure by a first heater disposed in opposition to a back surface of the substrate and a second heater disposed in opposition to a front surface of the substrate, wherein a heat quantity of the second heater at the heating step is smaller than a heat quantity of the first heater at the heating step; and a first cooling step of cooling at least the substrate by a first cooling body arranged in opposition to the back surface of the substrate and sandwiching the first heater therebetween, wherein the first cooling step is conducted after the heating step.

5. The heating treatment method according to claim 4, wherein during the heating step, heat from the first or second heater is reflected by a heat reflecting member toward the substrate.

6. The heating treatment method according to claim 5, wherein the first cooling body has thermal emissivity larger than that of the heat reflecting member.

7. The heating treatment method according to claim 4, further comprising a second cooling step of cooling at least the substrate by a second cooling body arranged in opposition to the front surface of the substrate and sandwiching the second heater therebetween.

8. The heating treatment method according to claim 7, wherein the second cooling body has a heat absorption quantity at the cooling of the substrate smaller than that of the first cooling body.

9. The heating treatment method according to claim 7, wherein after heating the substrate and the structure in the heating step, the first and second cooling steps are performed.

10. The heating treatment method according to claim 8, wherein after heating the substrate and the structure in the heating step, the cooling steps are performed.

\* \* \* \* \*

UNITED STATES PATENT AND TRADEMARK OFFICE
CERTIFICATE OF CORRECTION

| | |
|---|---|
| PATENT NO. | : 7,110,665 B2 |
| APPLICATION NO. | : 10/944760 |
| DATED | : September 19, 2006 |
| INVENTOR(S) | : Shigeto Kamata et al. |

Page 1 of 1

It is certified that error appears in the above-identified patent and that said Letters Patent is hereby corrected as shown below:

COLUMN 4:

Line 50, "fist" should read --first--.

Signed and Sealed this

Sixth Day of May, 2008

JON W. DUDAS
*Director of the United States Patent and Trademark Office*